(12) United States Patent
Itoh

(10) Patent No.: US 6,235,616 B1
(45) Date of Patent: May 22, 2001

(54) METHOD OF ION IMPLANTATION INTO SILICON CARBIDE SEMICONDUCTORS

(75) Inventor: Hisayoshi Itoh, Gunma-ken (JP)

(73) Assignee: Japan Atomic Energy Research Institute, Tokyo (JP)

( * ) Notice: Subject to any disclaimer, the term of this patent is extended or adjusted under 35 U.S.C. 154(b) by 0 days.

(21) Appl. No.: 09/277,733

(22) Filed: Mar. 29, 1999

(30) Foreign Application Priority Data

Aug. 26, 1998 (JP) .................................................. 10-240021

(51) Int. Cl.⁷ .................................................. H01L 21/265
(52) U.S. Cl. ............................ 438/518; 438/510; 438/514
(58) Field of Search .................................. 438/518, 510, 438/514, 960

(56) References Cited

U.S. PATENT DOCUMENTS 5,604,135 * 2/1997 Edmond et al. .

OTHER PUBLICATIONS

Hisayoshi Itoh et al.; "Effects of C or Si Co–Implantation on the Electrical Activation of B Atoms Implanted in 4H–SiC"; Applied Physic Letters, vol. 73. No. 10; Sep. 7, 1998; pp 1427–1429.

* cited by examiner

Primary Examiner—Kevin M. Picardat
Assistant Examiner—D. M. Collins
(74) Attorney, Agent, or Firm—Banner & Witcoff, Ltd.

(57) ABSTRACT

Acceptor atoms such as aluminum (Al) and boron (B) are introduced into a silicon carbide (SiC) semiconductor by ion implantation, and carbon (C) atoms additionally are introduced by ion implantation, whereby the electrical activation of the acceptor atoms is enhanced while controlling their diffusion that results from a subsequent thermal treatment. The process enables the production of a p-type SiC semiconductor of better quality.

8 Claims, 2 Drawing Sheets

METHOD OF ION IMPLANTATION INTO SILICON CARBIDE SEMICONDUCTORS

BACKGROUND OF THE INVENTION

This invention relates to acceptor atom introduction that is performed in fabricating SiC semiconductor devices. More particularly, the invention performs ion implantation of C atoms in addition to acceptor atoms, thereby forming p-type SiC of better quality in local areas and contributing to the fabrication of SiC integrated circuits.

As is well known, p-type conduction characteristics are attained by ion implantation of Al, B and other acceptor impurities into SiC. Problems with this conventional approach are that the introduced acceptor atoms are poorly activated electrically and that they tend to diffuse outwardly as the result of a heat treatment conducted after the ion implantation. No technology has not yet been established in forming p-type SiC of better quality that is suitable for device fabrication.

SUMMARY OF THE INVENTION

The present invention has been accomplished under these circumstances and has as an object enhancing the electrical activation of acceptor atoms introduced into SiC while controlling their thermal diffusion, thereby forming p-type SiC of better quality that is suitable for device fabrication.

This object of the invention can be attained by a process for producing p-type SiC semiconductor of better quality which comprises the step of introducing acceptor atoms such as aluminum (Al) and boron (B) into a silicon carbide semiconductor (SiC) by ion implantation together with the additional ion implantation of carbon (C) atoms, thereby enhancing the electrical activation of the implanted acceptor atoms while controlling their diffusion due to a thermal treatment.

The acceptor atoms such as Al and B that have been introduced into SiC are electrically activated after they occupy substitutional positions in the Si lattice of the SiC crystal. If C atoms are additionally introduced according to the present invention, more vacancies form in the Si lattice to accelerate the process of substitution of the acceptor atoms for the Si atoms, thereby increasing the concentration of effective, carrier generating acceptors.

The acceptor atoms occupying substitutional position in the Si lattice diffuse at a slower speed than when they are at interstitial sites, and this explains why the additional C ion implantation is effective in controlling the diffusion of acceptor atoms during a subsequent heat treatment. Thus, satisfactory p-type SiC can be formed in local areas by the additional C ion implantation.

DETAILED DESCRIPTION OF THE INVENTION

According to the present invention, the additional introduction of C atoms contributes to enhance the electrical activation of acceptor atoms implanted into SiC, whereupon the concentration of positive holes which are a predominant factor in determining electrical conductivity is increased while, at the same time, redistribution of the introduced acceptor atoms is reduced, thus contributing to the formation of p-type SiC of better quality. The present invention will now be described with reference to two specific examples.

EXAMPLE 1

Enhancing the Electrical Activation of Acceptor Atoms by Additional Implantation of C Atoms Aluminum (Al) or boron (B) atoms were introduced by ion implantation into an n-type hexagonal, single crystal SiC, which was then heat treated at 1630° C. for 30 minutes to fabricate a semiconductor device (Al or B implanted at dose of $5 \times 10^{18}$ atoms/cm$^3$). Another sample of semiconductor device was fabricated by performing the same heat treatment after implanting C atoms in addition to the acceptor atoms (C implanted at a dose of $5 \times 10^{18}$ atoms/cm$^3$). The concentrations of positive holes in the two samples were measured at room temperature and the results are shown in FIG. 1.

Figure 1:
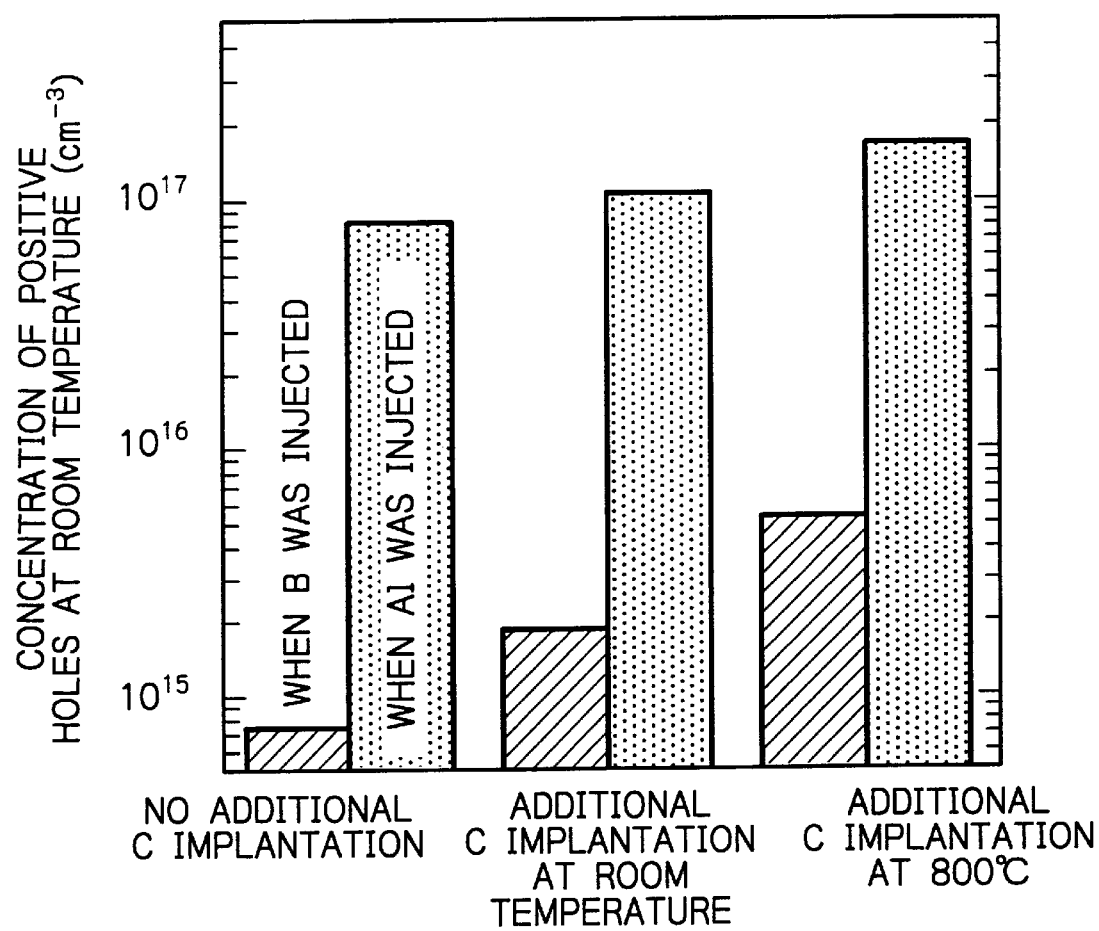
FIG. 1 is a graph showing the effect of additional C ion implantation on the concentration of positive holes at room temperature in semiconductor devices fabricated by ion implantation of B or Al atoms into an n-type hexagonal, single crystal SiC.

As is clear from FIG. 1 (in the experiments, Al, B and C were implanted at a dose of $5 \times 10^{18}$ atoms/cm$^3$; C atoms were implanted either at room temperature or at 800° C. whereas Al and B atoms were implanted at room temperature; the heat treatment following ion implantation was performed at 1630° C. for 30 minutes), the additional implantation of C atoms increased the concentration of positive holes and enhanced the electrical activation of the introduced acceptor atoms. The effectiveness of the additional implantation of C atoms increased at an elevated temperature. As a matter of fact, the additional implantation of C atoms at 800° C. resulted in a higher concentration of positive holes than when it was performed at room temperature and the increase was about two-fold in the case of Al and about 10-fold with B.

EXAMPLE 2

Controlling the Diffusion of Acceptor Atoms by Additional C Implantation

Boron (B) atoms were introduced by ion implantation into an n-type hexagonal, single crystal SiC, which was then heat treated at 1700° C. for 30 minutes to fabricate a semiconductor device (B implanted at a dose of $5 \times 10^{18}$ atoms/cm$^3$). Another sample of semiconductor device was fabricated by performing the same heat treatment after additional implantation of C atoms (C implanted at a dose of $5 \times 10^{18}$/cm$^3$). The depth profiles of B atoms in the two samples were measured and the results are shown in FIG. 2.

Figure 2:
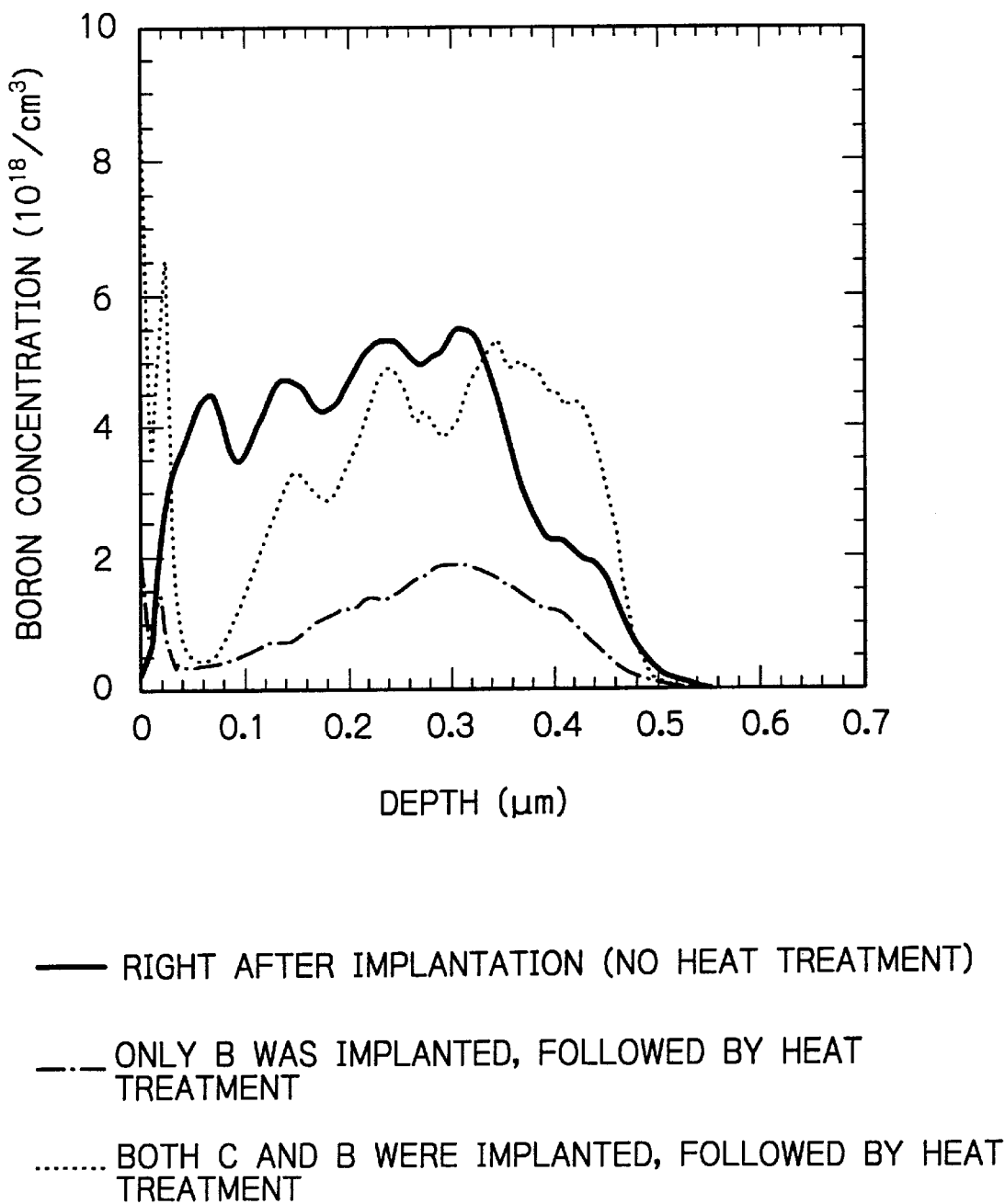
FIG. 2 is a graph showing the effect of additional C ion implantation on the thermally induced change in the depth profile of B atoms introduced by ion implantation into an n-type hexagonal, single crystal SiC.

As is clear from FIG. 2 (in the experiments, B or C was implanted at room temperature in a dose of $5 \times 10^{18}$ atoms/cm$^3$; the heat treatment following ion implantation was performed at 1700° C. for 30 minutes), only about 30% of the implanted B atoms remained intact within the device after the heat treatment in the case of ion implantation of B only. When additional C ion implantation was performed, on the other hand, additional C implantation could control B diffusion so that about 90% of the implanted B atoms remained intact within the device.

According to the invention, C atoms are implanted in addition to acceptor atoms, enabling the preparation of p-type SiC of better quality and contributing to a higher quality of the semiconductor device using that SiC. In addition, the diffusion of the introduced acceptor atoms is sufficiently controlled so that there is no need to consider the concentration of acceptor atoms that will be lost in the heat treatment conducted after the ion implantation, and this offers the advantage of facilitating the device design.

What is claimed is:

1. A method of producing a high quality p-type silicon carbide semiconductor comprising:

introducing acceptor atoms into a silicon carbide semiconductor by ion implantation; and introducing carbon atoms into the silicon carbide semiconductor by ion implantation.

2. A method of controlling thermally-induced diffusion of acceptor atoms implanted into silicon carbide comprising:

introducing carbon atoms into the silicon carbide by ion implantation.

3. The method of claim 1 wherein the acceptor atoms are selected from the group consisting of aluminum (Al), boron (B), and mixtures thereof.

4. The method of claim 1 wherein the ion implantation of carbon atoms is performed at a temperature of at least 800° C.

5. The method of claim 1 further comprising heat treating the silicon carbide semiconductor at 1630° C. or above after implanting the carbon atoms, whereby electrical activation of the acceptor atoms is enhanced.

6. The method of claim 2 wherein the acceptor atoms are selected from the group consisting of aluminum (Al), boron (B), and mixtures thereof.

7. The method of claim 2 wherein the ion implantation of carbon atoms is performed at a temperature of at least 800° C.

8. The method of claim 2 further comprising heat treating the silicon carbide at 1630° C. or above after implanting the carbon atoms, whereby electrical activation of the acceptor atoms is enhanced.

* * * * *